United States Patent
Ashjaee et al.

(10) Patent No.: US 6,777,338 B2
(45) Date of Patent: Aug. 17, 2004

(54) EDGE AND BEVEL CLEANING PROCESS AND SYSTEM

(75) Inventors: Jalal Ashjaee, Cupertino, CA (US); Rimma Volodarsky, San Francisco, CA (US); Cyprian E. Uzoh, Milpitas, CA (US); Bulent M. Basol, Manhattan Beach, CA (US); Homayoun Talieh, San Jose, CA (US)

(73) Assignee: Nutool, Inc., Milpitas, CA (US)

( * ) Notice: Subject to any disclaimer, the term of this patent is extended or adjusted under 35 U.S.C. 154(b) by 221 days.

(21) Appl. No.: 10/051,755

(22) Filed: Jan. 15, 2002

(65) Prior Publication Data

US 2002/0155648 A1 Oct. 24, 2002

Related U.S. Application Data

(60) Provisional application No. 60/276,103, filed on Mar. 14, 2001.

(51) Int. Cl.$^7$ ............... H01L 21/461; B24B 7/00; B24B 9/00

(52) U.S. Cl. ..................... 438/692; 451/177
(58) Field of Search ............. 438/692; 451/177, 451/44; 15/3.14; 134/16

(56) References Cited

U.S. PATENT DOCUMENTS

| | | | |
|---|---|---|---|
| 6,056,869 A | 5/2000 | Uzoh | 205/771 |
| 6,309,981 B1 | 10/2001 | Mayer et al. | 438/754 |
| 6,494,219 B1 * | 12/2002 | Nayak et al. | 134/56 R |
| 2001/0052159 A1 * | 12/2001 | Moinpour et al. | 15/102 |

* cited by examiner

*Primary Examiner*—Craig A. Thompson
(74) *Attorney, Agent, or Firm*—Pillsbury Winthrop

(57) ABSTRACT

The present invention provides at least one nozzle that sprays a rotating workpiece with an etchant at an edge thereof. The at least one nozzle is located in an upper chamber of a vertically configured processing subsystem that also includes mechanisms for plating, cleaning and drying in upper and lower chambers.

31 Claims, 4 Drawing Sheets

EDGE AND BEVEL CLEANING PROCESS AND SYSTEM

BACKGROUND OF THE INVENTION

This application claims the benefit of priority under 35 USC Section 119(e) to U.S. Provisional Application Serial No. 60/276,103 filed Mar. 14, 2001.

FIELD OF THE INVENTION

The present invention generally relates to semiconductor processing technologies and, more particularly, to a system and process that removes a conductive layer from the edge and/or bevel of a work piece.

DESCRIPTION OF THE RELATED ART

In the semiconductor industry, various processes can be used to deposit and etch conductive materials on the wafers. Deposition techniques include processes such as electrochemical deposition (ECD) and electro chemical mechanical deposition (ECMD). In both processes, a conductor is deposited on a semiconductor wafer or a work piece by having electrical current carried through an electrolyte that comes into contact with the surface of the wafer (cathode). A detailed description of the ECMD method and apparatus can be found in U.S. Pat. No. 6,176,952 to Talieh entitled "Method and Apparatus For Electro Chemical Mechanical Deposition", commonly owned by the assignee of the present invention.

Regardless of which process is used, the work piece is next transferred to a cleaning and drying station after the deposition step. During the cleaning steps, various residues generated by the deposition process are rinsed off the wafer, and subsequently the wafer is dried by spinning and if necessary blowing nitrogen on its surface. In one design, the ECD or ECMD chamber and the rinse chamber can be stacked vertically in a vertical process chambers arrangement. In this arrangement, the plating process can be performed in a lower chamber, and the cleaning and drying can be carried out in an upper chamber after isolating the upper chamber from the lower chamber. One such vertical chamber is disclosed in the co-pending U.S. application Ser. No. 09/466,014, entitled "Vertically Configured Chamber Used for Multiple Processes", filed Dec. 17, 1999, commonly owned by the assignee of the present invention.

Conventionally, after the plating process is performed to deposit the conductive material, the work piece may be polished mechanically and chemically, e.g., chemical mechanical polishing (CMP), so as to remove overburden conductive material from the front face of the work piece. As is known, the material removal can also be carried out using chemical etching or electrochemical etching. In electrochemical etching, the wafer is made anodic (positive) with respect to an electrode after completing an ECD or ECMD process.

Copper is a preferred conductive material that can be deposited by ECD and ECMD processes. Therefore it will be used as an example. As a result of electroplating process, copper may be deposited on the edges and sides, i.e., bevel, of the wafer where no ICs or circuits are located. Such remaining copper, which is often referred to as the edge copper, may migrate to neighboring active regions from the sides and edges of the wafer. Further, copper from a wafer edge may contaminate the wafer transport system, and so be passed on to contaminate other wafers. For this reason, it is important to remove the copper from the edges and the bevel of the wafer following each copper plating process step.

To this end, there is a need for removing edge copper in copper plating processes in an efficient and effective manner with high throughput.

SUMMARY OF THE INVENTION

It is an object of the present invention to provide a method and apparatus for removing an edge conductor that exists on a workpiece.

It is a further object of the present invention to provide a method and apparatus for removing an edge conductor in a vertically configured chamber that also performs plating, cleaning and drying.

It is a further object of the invention to provide a method and apparatus for removing an edge conductor using a stream of etchant applied to the edge of a workpiece.

The above object of the invention, among others, either singly or in combination, are achieved by the present invention by providing at least one nozzle that sprays a rotating workpiece with an etchant at an edge thereof. The at least one nozzle is located in an upper chamber of a vertically configured processing subsystem that also includes mechanisms for plating, cleaning and drying in upper and lower chambers.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENT

Figure 1:
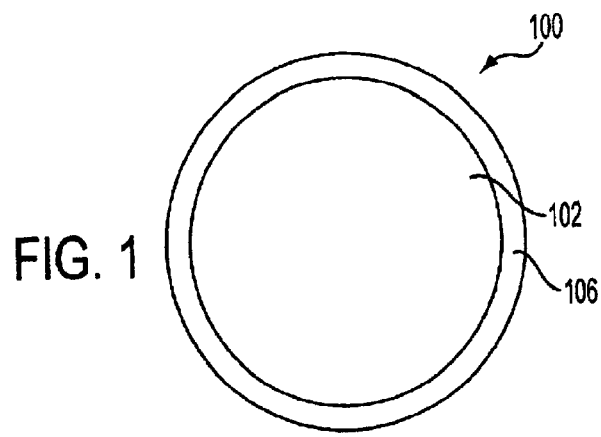
FIG. 1 illustrates a wafer on which edge removal is performed according to the present invention.
Figure 2:
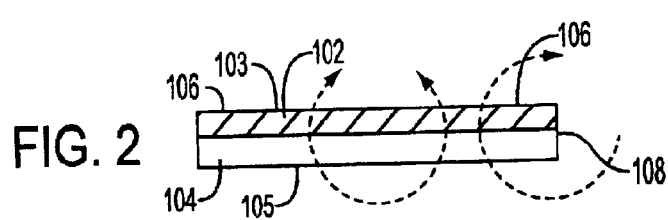
FIG. 2 illustrates a cross section of a wafer on which edge removal is performed according to the present invention.

FIG. 1 is a top plane view of a plated work piece 100 such as a semiconductor wafer. As also shown in FIG. 2 in side view, the plated wafer 100 comprises a top layer 102 having a top surface 103, a bottom layer 104 having a bottom surface 105, a top surface edge 106 and a wafer side 108 or bevel around the perimeter of the wafer surfaces 103 and 105. In this embodiment, the top layer 102 of the plated wafer 100 is comprised of a layer of electroplated conductive material, for example copper, and the bottom layer 104 is comprised of a semiconductor substrate, such as a silicon substrate. In this embodiment copper is electroplated on the substrate 104 using ECMD or ECD processes.

Figure 3:
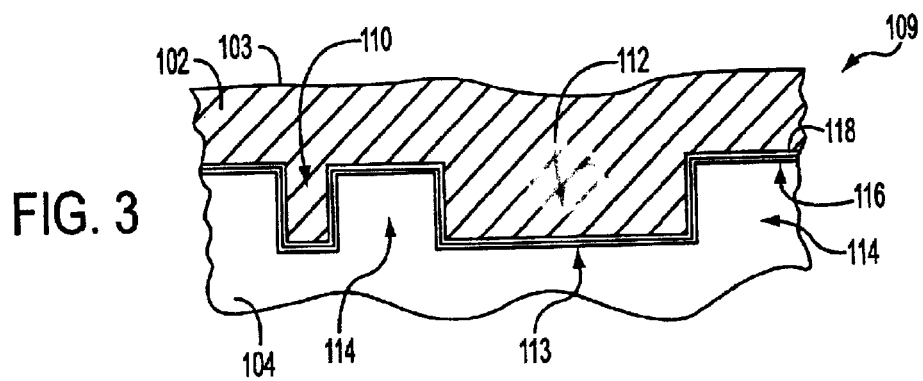
FIG. 3 illustrates a more detailed cross section of a portion of a wafer on which edge removal is performed according to the present invention.

FIG. 3 is an enlarged partial cross-sectional view of near top surface region 109 of the wafer 100, shown in FIG. 2, which comprises a via and a trench feature 110 and 112 formed in an insulating region 114 which is previously formed on the wafer surface. As shown in FIG. 3, the surface region 109 of the plated wafer 100 may comprise a plurality of via, trench and other features such as dual damascene features. The features 110, 112 and the surface of the insulator between the features may be lined with a diffusion barrier/glue layer 116 and a seed layer 118, i.e., copper seed layer for the case of copper deposition. In most cases, the barrier layer 116 and/or the seed layer 118 extends onto the top surface edge 106, and sometimes onto the wafer side 108. In fact, one or both of these layers may wrap around and coat portions of the bottom surface 105 that is adjacent the wafer side 108. Since, during the electroplating, copper only deposits on the conductive regions that are coated with barrier or copper seed layer or with a barrier/seed composite layer, this, in turn, causes copper to deposit on the edge 106, the side 108 and the bottom surface 105. Electroplated copper layer 102 fills the vias 110 and the trenches 112 and forms the interconnect structure of the wafer 100, after the CMP process that removes the excess copper and the barrier layer from the top surface of the insulating region 114, therefore electrically isolating the copper regions within the various features. The interconnects are used to electrically connect different active portions and levels in the chip or IC.

Figure 4:
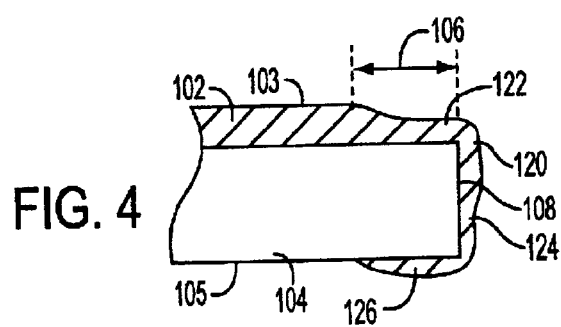
FIG. 4 illustrates a more detailed cross section of an edge portion of a wafer on which edge removal is performed according to the present invention.

As mentioned above, the copper layer 102 may also extend onto the side 108 and even the bottom surface 105 adjacent the edge 106, and thus forming an unwanted copper region 120 shown in FIG. 4. The edge copper 120 may form around the circumference of the wafer 100. As exemplified in FIG. 4, the edge copper 120 may have an upper portion 122, a side portion 124 and a lower portion 126. The edge copper portions 122–126 can be removed from the top surface edge 106, side 108 and bottom surface 105 by applying a copper etching solution through the process of the present invention. Although, in this embodiment, the edge copper is exemplified using the upper, side and lower portions, it is understood that this is for the purpose of exemplifying the problem; consequently, the unwanted copper may just have the upper portion.

It should be noted that even in the case where copper may not be deposited in the regions 106, 108 and 105 of FIG. 4 during the plating step, presence of the copper seed layer in those areas may exist and is typically undesirable. And a conventional CMP step carried out after the plating step may be able to remove any copper in the edge 106, but would not be effective in removing copper from the side 108 and the bottom surface 105.

Figure 5:
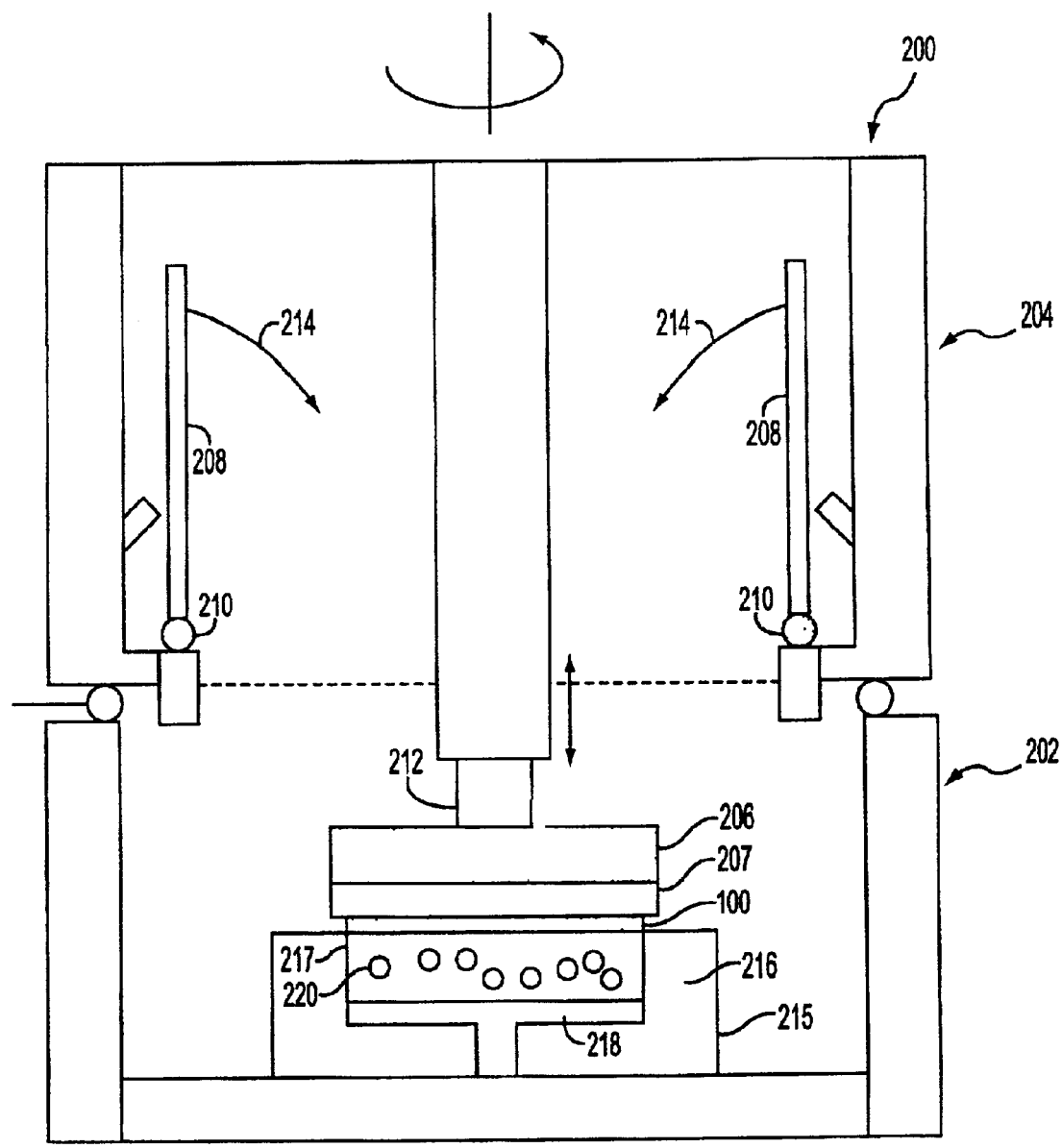
FIG. 5 illustrates a vertical chamber in which edge removal is performed according to the present invention.

The copper layer 102 may be deposited on wafer 100 using an electroplating process and system 200 shown in FIG. 5. The system 200 may be a vertical chamber comprising a lower section 202 and an upper section 204. One such vertical chamber is disclosed in the co-pending U.S. application Ser. No. 09/466,014, entitled "Vertically Configured Chamber Used for Multiple Processes", filed Dec. 17, 1999, commonly owned by the assignee of the present invention.

Accordingly, according to this embodiment, an edge copper removal process is performed within the upper chamber. Thus, while the lower chamber will comprise some type of plating section, preferably comprise an ECMD process section but also a conventional ECD process section, the upper section will contain a cleaning and edge copper removal and drying section. The upper and lower sections have a movable barrier, described in one specific embodiment as guard flaps, which keep the various materials and solutions used in the processes of the upper chamber from reaching the lower chamber, as described further herein. In one embodiment of the process, an ECMD process is initially performed in the lower section 202, and in the following stage of the process, a cleaning by rinsing may be performed in the upper section 204. As will be described more fully below, after the cleaning, in the upper section 204, an edge copper removal process is performed. The edge copper removal process is followed by a second cleaning and drying process.

A wafer holder 206 supports the wafer 100 as deposition process is performed in the lower section 202. The wafer holder may comprise, preferably, circular chuck 207 upon which the wafer 100 is loaded, bottom surface 105 first (see FIG. 2), and secured. Guard flaps 208 via linkage shafts/rollers 210 are positioned vertically such that the wafer holder 206 using a shaft 212 can be lowered into the lower section 202. The shaft 212 is further adapted to move side to side and to rotate about the vertical axis of the shaft 212. During the cleaning, edge copper removal and drying, the wafer holder 206 is raised vertically into the upper section 204 and the flaps 208 are closed by moving them in the direction of the arrows 214.

During the ECMD process, as mentioned above, copper is applied in vias, trenches and/or other desired features in the wafer 100 (see also FIG. 3) to form a generally flat copper layer over the features. An ECMD apparatus 215 may comprise a pad assembly 216 having a pad 217 placed on an anode 218 for depositing the copper on the wafer 100 while the wafer 100 is polished. The copper can be applied using an electrolyte solution.

Figure 6:
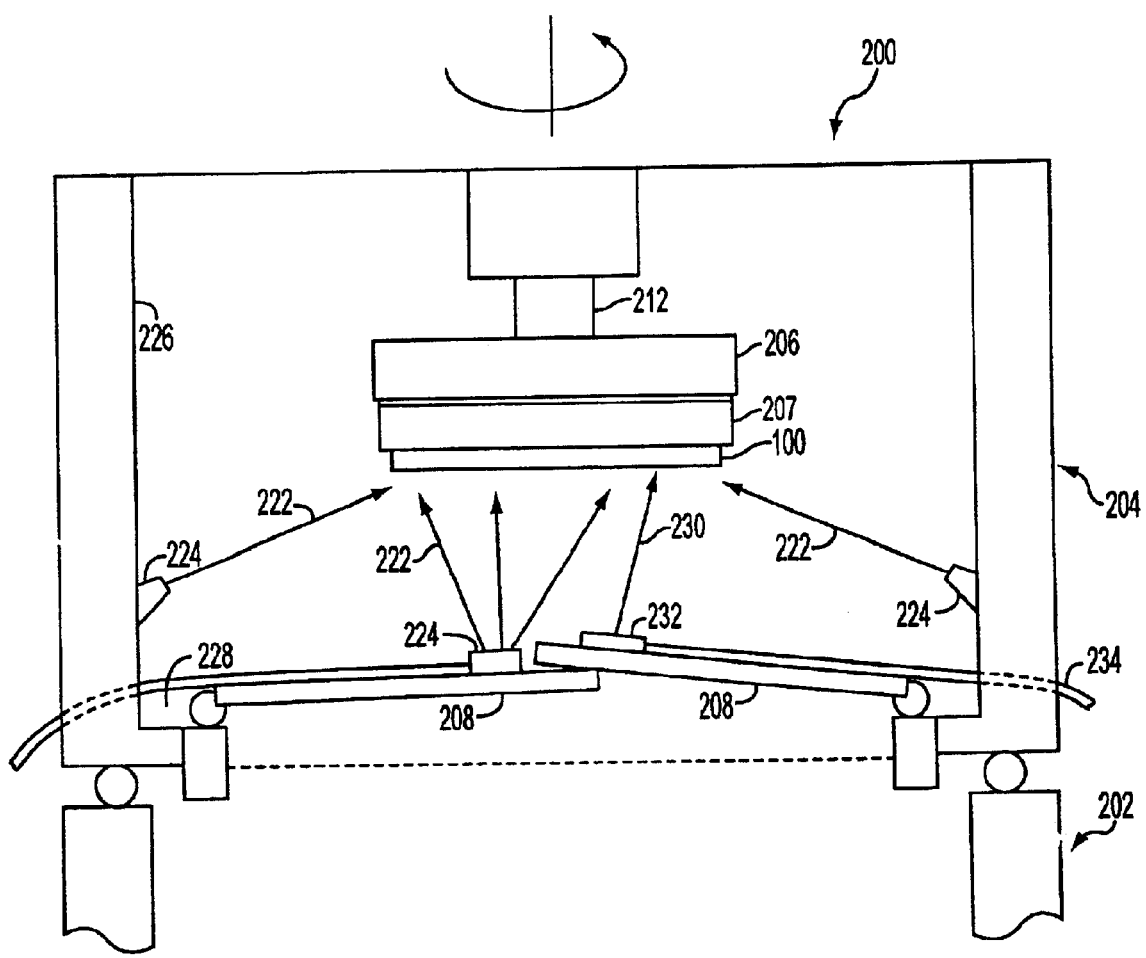
FIGS. 6 and 7 illustrate the edge removal apparatus of the present invention in further detail.
Figure 7:
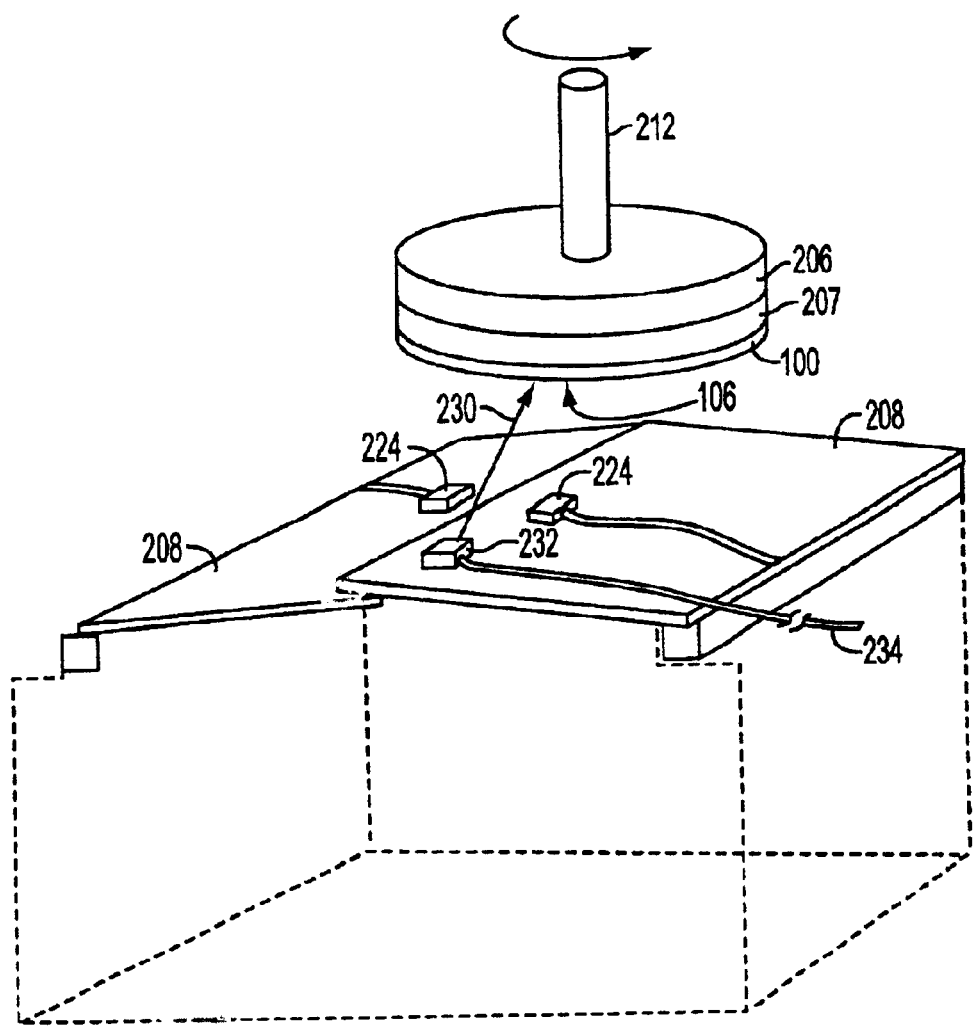

As shown in FIGS. 6 and 7, after the deposition takes place in the lower section 202 of the system 200, the wafer holder 206 is raised using the shaft 212 to approximately its uppermost position. Then, the flaps 208 are moved from their vertical position to their horizontal position to separate the lower section 202 from the upper section 204. Once the flaps 208 are in closed position the cleaning is carried out. During the cleaning by rinsing, the holder 206 may be lowered towards the flaps 208.

A conventional cleaning solution, depicted by the arrows 222, may be provided through nozzles 224 which are located on the side walls 226 of the upper section and/or on the flaps 208. Used cleaning solution is drained out of the section 204 using outlet channels 228 along the side walls 226. This solution does not mix with the electrolyte in the lower section 202 due to the presence of the flaps 208 in the closed position. During the cleaning step, the wafer 100 is rotated and the cleaning solution is applied to the wafer 100. The wafer 100 may be spun dried by rotating the wafer at high rpm Additionally, clean and dry air or inert gas like nitrogen may also be blown on the wafer to help dry it. After the cleaning and optionally drying processes, edge copper removal process is performed in the same upper chamber 204.

Referring to FIGS. 4, 6 and 7, during the edge copper removal, a conventional etching solution, depicted by the arrow 230, is applied on the edge 106 of the wafer while the wafer 100 is rotated at approximately 20 to 1000 rpm, preferably at 50 to 500 rpm. Etching solutions are typically acidic and oxidizing solutions which oxidize copper and remove it at a high rate. Generally, the etching rate may vary depending on the process time, temperature and the chemical composition of the etching solution. The etchant is applied in the form of a well regulated stream through at least one nozzle 232 that is preferably mounted on the flaps 208 or otherwise located relative to the wafer 100 such that the nozzle 232 directs a stream of the etching solution toward the wafer 100 in a manner that the stream has a horizontal component that is directed away from the center of the wafer 100, thus assisting with keeping the etching solution away from the central portion of the wafer and at the edge 106 of the wafer 100.

Figure 8:
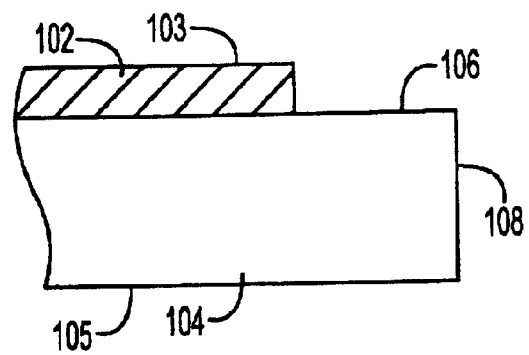
FIG. 8 illustrates an edge portion of a wafer that has had copper removed therefrom according to the present invention.

The etching solution can be fed to the nozzle 232 through a feed tube 234 that is connected to a feed pump (not shown). The nozzle 232 directs the solution to the edge 106 as a tightly controlled stream of etching solution. The etching solution can be applied in various amounts for various periods of time, preferably in a range of 1 to 10 ml per second for approximately 5 to 20 seconds. Owing to both centrifugal force generated by the spinning wafer and the surface tension of the etchant, the etching solution arrives at the edge 106 at an angle and the stream of etchant that is outwardly directed to the upper portion 122 of the edge copper 120 flows over the portions 124 and 126 of the edge bead 120 and covers them. The angle at which the etching solution strikes the edge 106 can also be varied, which allows for narrowing or broadening of the etched region. Etched region width can also be changed by moving the wafer and/or the nozzle laterally or vertically. If the nozzle is constantly kept at a given angle, the etched region may be narrowed or broadened by moving the wafer up and down or moving it laterally. Similarly if the wafer is kept in the same lateral position and same elevation (but rotated), the etched region can be broadened or narrowed by varying the angle of the nozzle with respect to the wafer. As long as the above given process works in the manner described, the nozzle may be positioned on the walls or other places, and within the scope of the invention. As shown in FIG. 8, accordingly, the etching solution etches and removes the edge copper portions 122–126 from the edge 106, side 108 and the bottom surface 105. In order to increase the etch rate, during the process, the etching solution or the wafer 206 or both may be heated approximately to a temperature less than 100° C., preferably 40–60° C. Heating of the etching solution or the wafer increases the etch rate and may also assist the following drying step that follows rinsing step. After the etching process, the wafer is cleaned and dried.

Although various preferred embodiments have been described in detail above, those skilled in the art will readily appreciate that many modifications of the exemplary embodiment are possible without materially departing from the novel teachings and advantages of this invention.

What is claimed is:

1. A method of operating upon a workpiece having a top surface and a bevel edge with a conductive layer comprising the steps of:
   performing workpiece processing on the top surface of the workpiece with the workpiece disposed in a lower chamber of a vertical chamber assembly;
   moving the workpiece from the lower chamber to an upper chamber after the step of performing workpiece processing;
   sealing the upper chamber from the lower chamber with a moveable guard to prevent liquid fluid communication between the upper chamber and the lower chamber and provide a sealed upper chamber; and
   removing the bevel edge of the workpiece with the workpiece disposed in the sealed upper chamber of the vertical chamber assembly.

2. The method according to claim 1 wherein the step of removing includes the steps of:
   rotating the workpiece; and
   directing a stream of an etching solution to the bevel edge of the workpiece and a front edge surface of the conductive layer from a nozzle located within the sealed upper chamber while rotating the workpiece, thereby outwardly directing the stream of the etching solution from the front edge surface to the bevel edge of the workpiece and causing removal of the conductive material from the bevel edge and the front edge surface of the conductive layer.

3. The method according to claim 2, further including the step of spraying a cleaning solution onto the top surface of the workpiece with the workpiece disposed in the sealed upper chamber of the vertical chamber assembly.

4. The method according to claim 3 wherein the step of spraying takes place prior to the step of removing.

5. The method according to claim 4 further including the step of drying by rotating the workpiece after the step of spraying and prior to the step of removing.

6. The method according to claim 2 wherein the step of performing workpiece processing comprises depositing a conductor on the top surface of the conductive layer of the workpiece.

7. The method according to claim 6 wherein the step of performing workpiece processing performs electrochemical mechanical processing.

8. The method according to claim 7 wherein the step of performing electrochemical mechanical processing is an electrochemical mechanical deposition process.

9. The method according to claim 8 wherein the electrochemical mechanical deposition process uses a plating solution.

10. The method according to claim 9, further including the step of spraying a cleaning solution onto the top surface of the conductive layer with the workpiece disposed in the sealed upper chamber of the vertical chamber assembly.

11. The method according to claim 10 wherein the step of spraying takes place prior to the step of removing.

12. The method according to claim 11 further including drying by rotating the workpiece after the step of spraying and prior to the step of removing.

13. The method according to claim 1 wherein the step of performing workpiece processing deposits a conductor on the conductive layer of the workpiece.

14. The method according to claim 1 wherein the step of performing workpiece processing performs electrochemical mechanical processing.

15. The method according to claim 14 wherein the electrochemical mechanical processing is an electrochemical mechanical deposition process.

16. The method according to claim 15 wherein the electrochemical mechanical deposition process uses a plating solution.

17. The method according to claim 16, further including the step of spraying a cleaning solution onto the top surface of the conductive layer with the workpiece disposed in the sealed upper chamber of the vertical chamber assembly.

18. The method according to claim 17 wherein the step of spraying takes place prior to the step of removing.

19. The method according to claim 18 further including drying by rotating the workpiece after the step of spraying and prior to the step of removing.

20. The method according to claim 1, further including the step of spraying a cleaning solution onto the top surface of the workpiece with the workpiece disposed in the sealed upper chamber of the vertical chamber assembly.

21. The method according to claim 20 wherein the step of spraying takes place prior to the step of removing.

22. The method according to claim 18 further including drying by rotating the workpiece after the step of spraying and prior to the step of removing.

23. An apparatus for operating upon a workpiece having a front surface and a bevel edge with a conductive layer comprising:
- a vertical chamber assembly including an upper chamber and a lower chamber, the upper chamber being separable from the lower chamber by a moveable guard to provide a sealed upper chamber and prevent liquid fluid communication from the sealed upper chamber to the lower chamber;
- a moveable and rotatable workpiece holder that holds and rotates the workpiece with the workpiece disposed in either the upper chamber and the lower chamber, and adapted to move the workpiece between the upper chamber and the lower chamber;
- a workpiece processing system disposed in the lower chamber for operating on the conductive layer of the workpiece; and
- a bevel edge removal system disposed in the upper chamber.

24. The apparatus according to claim 23 further including a workpiece cleaning system disposed in the upper chamber.

25. The apparatus according to claim 24 wherein the bevel edge removal system includes at least one edge conductor material removal device for supplying a stream of an etching solution toward at least a front conductive surface edge of the workpiece.

26. The apparatus according to claim 25 wherein the edge conductor material removal device comprises at least one nozzle disposed within a position relative to the workpiece such that the stream of the etching solution is directed outwardly toward the front conductive surface edge of the workpiece.

27. The apparatus according to claim 26 wherein the workpiece cleaning system includes a cleaning nozzle disposed for directing a cleaning solution to the front surface of the workpiece.

28. The apparatus according to claim 23 wherein the bevel edge removal system includes at least one edge conductor material removal device for supplying a stream of an etching solution toward at least a front conductive surface edge of the workpiece.

29. The apparatus according to claim 28 wherein the edge copper removal device comprises at least one nozzle disposed within a position relative to the workpiece such that the stream of the etching solution is directed outwardly toward the front conductive surface edge of the workpiece.

30. The apparatus according to claim 23 wherein the workpiece processing system is an electrochemical mechanical processing system.

31. The apparatus according to claim 30 wherein the electrochemical mechanical processing system is an electrochemical mechanical deposition system.

* * * * *